US012607526B1

(12) United States Patent
Wong et al.

(10) Patent No.: US 12,607,526 B1
(45) Date of Patent: Apr. 21, 2026

(54) ROSETTE STRAIN GAGE AND METHOD OF FABRICATION

(71) Applicant: Piezo-Metrics Inc, Simi Valley, CA (US)

(72) Inventors: Franklin Curtis Wong, Simi Valley, CA (US); Robert Andrew Mueller, Simi Valley, CA (US); Stephen Gilbert Gonya, Binghamton, NY (US)

(73) Assignee: Piezo-Metrics Inc, Simi Valley, CA (US)

( * ) Notice: Subject to any disclaimer, the term of this patent is extended or adjusted under 35 U.S.C. 154(b) by 334 days.

(21) Appl. No.: 18/581,802

(22) Filed: Feb. 20, 2024

Related U.S. Application Data

(60) Provisional application No. 63/447,742, filed on Feb. 23, 2023.

(51) Int. Cl.
*G01L 1/22* (2006.01)
*B81C 3/00* (2006.01)

(52) U.S. Cl.
CPC ............ *G01L 1/2293* (2013.01); *B81C 3/001* (2013.01); *B81C 3/004* (2013.01)

(58) Field of Classification Search
CPC ........ G01L 1/2293; B81C 3/001; B81C 3/004
See application file for complete search history.

(56) References Cited

U.S. PATENT DOCUMENTS

| | | | |
|---|---|---|---|
| 11,712,887 B2 * | 8/2023 | Gardner | B41J 2/04508 |
| | | | 347/14 |
| 11,906,375 B1 | 2/2024 | Wong et al. | |
| 2019/0154527 A1 * | 5/2019 | Zanchi | G01L 9/0042 |
| 2020/0182715 A1 * | 6/2020 | Fyfe | G01L 1/242 |

FOREIGN PATENT DOCUMENTS

| | | | | |
|---|---|---|---|---|
| EP | 2425203 B1 * | 11/2020 | | G01B 7/18 |

* cited by examiner

*Primary Examiner* — Thomas M Hammond, III
(74) *Attorney, Agent, or Firm* — Kaplan Breyer Schwarz, LLP

(57) ABSTRACT

The teachings of the present disclosure enable rosette strain gages that can be cost-effectively produced in high volume with substantially uniform performance. Rosette strain gages in accordance with the present disclosure comprise a plurality of semiconductor strain gages that are sculpted from a device layer of a semiconductor-on-insulator wafer using deep reactive ion etching, yielding very good control over their electrical properties and physical dimensions. The strain gages are provided to an automated assembly system while attached to a frame via one or more sprues that are configured to ease their removal by the automated assembly system. The strain gages are mounted on a rosette substrate having an arrangement of contact pads and traces for connecting pairs of contact pads to different gages. The materials of the rosette substrate and strain gages are selected to efficiently transfer strain from an object under test to the strain gages.

23 Claims, 6 Drawing Sheets

Rosette Strain Gage 100

Contact Pad 102-1

Traces 106

Substate 102

Material M1

Traces 106

Rosette Substrate 110

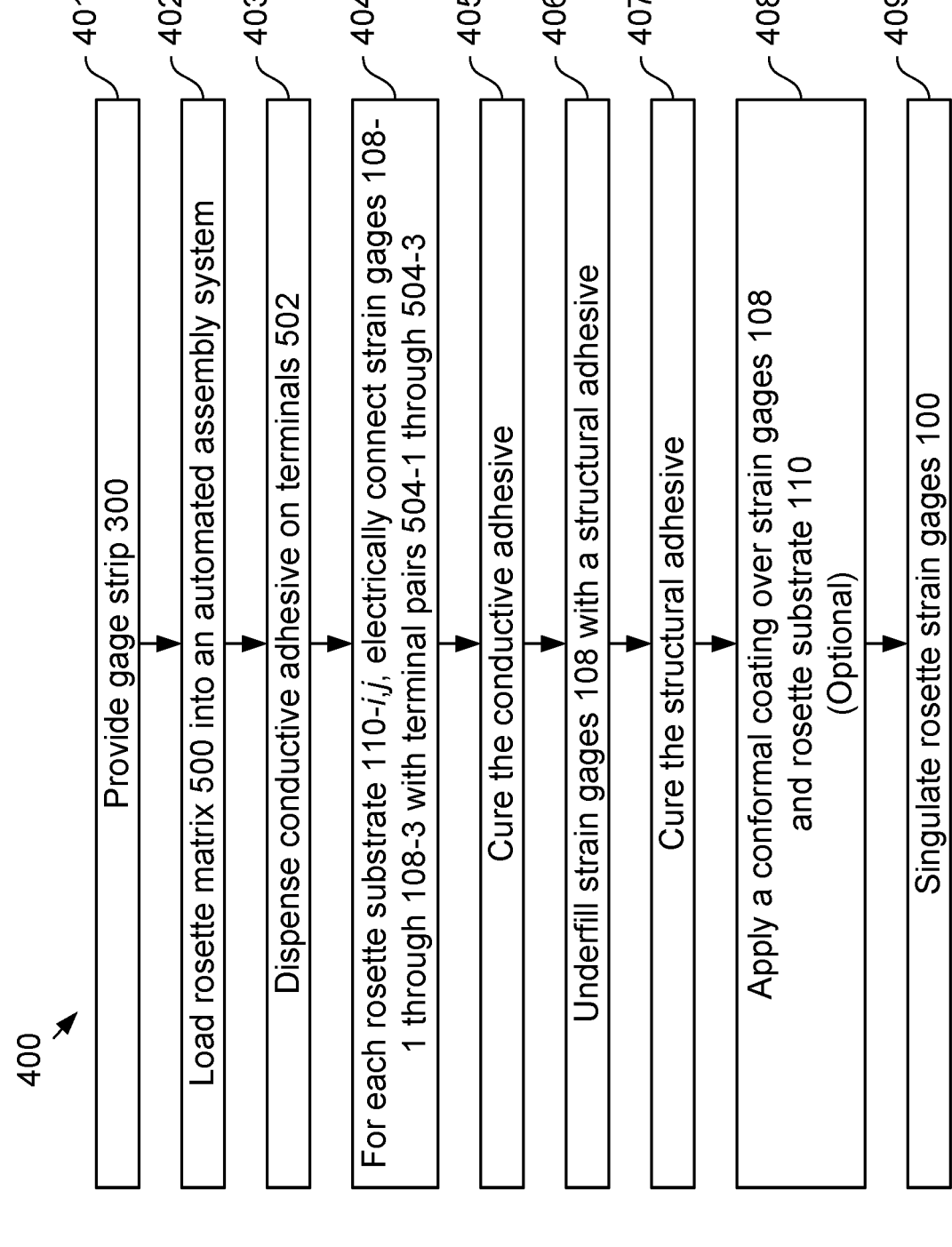

Provide gage strip 300 — 401

Load rosette matrix 500 into an automated assembly system — 402

Dispense conductive adhesive on terminals 502 — 403

For each rosette substrate 110-*i,j*, electrically connect strain gages 108-1 through 108-3 with terminal pairs 504-1 through 504-3 — 404

Cure the conductive adhesive — 405

Underfill strain gages 108 with a structural adhesive — 406

Cure the structural adhesive — 407

Apply a conformal coating over strain gages 108 and rosette substrate 110 (Optional) — 408

Singulate rosette strain gages 100 — 409

FIG. 5B

Rosette Substrate 110-*i,j*

1

ROSETTE STRAIN GAGE AND METHOD OF FABRICATION

CROSS REFERENCE TO RELATED APPLICATIONS

This application claims the benefit of U.S. Provisional Patent Application Ser. No. 63/447,742 filed Feb. 23, 2023, which is incorporated by reference as if set forth at length herein.

TECHNICAL FIELD

The present disclosure is directed to strain gages in general and, more specifically, to high-volume fabrication of semiconductor rosette strain gages having well-controlled performance specifications.

BACKGROUND

The strain gauge based on electrical resistance change due to metal-wire deformation is well known. The first application of a strain gauge involved bonding the metal wire, shaped in a serpentine pattern, directly to a test structure before making electrical resistance measurements. The serpentine pattern provided amplification of the resistance change due to strain, as well as biasing the strain measurement along one axis in the pattern to give a unidirectional measurement of strain. However, installation of these early strain gauges was an arduous process and introduced variability into their performance, thereby degrading their utility.

Improved metal-wire strain gauges were developed in the early 1940's to reduce the variability of the gauge measurements and reduce the complexity of handling and installation. Such a strain gauge comprises a metal wire bonded onto a thin, non-conducting substrate that could be adhered to the structure under test. At the same time, it was recognized that more than one strain gauge pattern could be included on a single substrate, and these different strain gauges could be arranged in a variety of angular and linear combinations to enable measurement of the two-dimensional state of strain at a point in a stressed structure. Such a strain gauge configuration is referred to as a "rosette strain gauge."

Since that time, the basic unidirectional metal-wire strain gauge and the metal-wire rosette strain gauge have undergone many improvements to increase strain measurement accuracy and to simplify and increase consistency of the strain gauge installation process. Modern encapsulated metal-foil strain gauges or rosette strain gauges are manufactured to exacting specifications to give consistent nominal resistance, thermal response behavior and gauge factor. The gauge factor is the sensitivity of the strain gauge's change in resistance to a change in mechanical strain. A typical gauge factor of a metal-foil strain gauge is two (2).

During the years in which the metal-foil strain gauge was being developed and improved, strain gauges based on different resistive materials were also pursued. One such "alternative material" strain gauge is the semiconductor strain gauge (typically referred to as a strain "gage," rather than "gauge," to distinguish from metal-foil devices). A semiconductor strain gage (hereinafter referred to simply as a "strain gage") is particularly attractive for many applications due to strain gages having significantly greater gage factors than metal-foil strain gauges. In some cases, a strain gage can have a gage factor that is greater than 140.

Unfortunately, while prior-art strain gages exhibit excellent performance, they are typically manufactured and installed in a similar manner to that of early metal-foil strain gauges-namely, they are provided as bare strain gages. As a result, they typically require installation by highly skilled technicians because they are very small and fragile.

In similar fashion, in the prior art, the manufacture of a prior-art semiconductor rosette strain gage (hereinafter referred to simply as a "rosette strain gages") has been performed by manually bonding individual strain gages onto a suitable rosette substrate. Such a manufacturing process is laborious and time consuming, making mass production difficult and expensive.

The need for strain gages and rosette strain gages that have consistent performance characteristics, high gage factors, are amenable to mass production at low-cost, and are easy to install remains, as yet, unmet in the prior art.

SUMMARY

The teachings of the present disclosure are directed to enabling rosette strain gages having tightly controlled performance characteristics using high-volume, highly reproducible processing techniques developed for large-scale production of modern integrated circuits.

An advance over the prior art is realized by forming a rosette strain gage using conventional surface-mount technology to die attach a plurality of leadless strain gages on a flexible substrate having a rosette matrix contact layout. The strain gages are batch fabricated using integrated-circuit production methods and provided to automated assembly system (e.g., a pick-and-place machine, etc.) while held in a gage strip. Within a gage strip, each strain gage is attached to a handling frame by one or more sprues that are structurally robust but configured to be easily breakable using an appropriate force and/or motion. As a result, each strain gage can be presented to the automated assembly equipment in a known configuration and orientation to facilitate their proper mounting on the substrate using conductive adhesive.

Furthermore, the combination of substrate, strain gage, and adhesive materials is selected to enable more effective transfer of strain from the object under test to the strain gages. As compared to prior-art rosette strain gages, therefore, the present disclosure enables rosette strain gages whose performance characteristics are more uniform and repeatable, and that can be produced in volume at lower cost.

An illustrative embodiment in accordance with the present disclosure is a rosette strain gage comprising three bar-shaped strain gages that are arranged on a flexible substrate such that each strain gage monitors strain along a different axis. Each strain gage is a leadless strain gage that includes a pair of bond pads that is electrically coupled with a different terminal-pair on the substrate via a conductive adhesive. In addition, each strain gage is mechanically coupled with the substrate via a structural adhesive that is configured to efficiently transfer strain from the substrate to the strain gages.

An illustrative method for fabricating a rosette strain gage in accordance with the present disclosure begins with providing a gage strip comprising a frame and a plurality of leadless strain gages. Each strain gage has a pair of bond pads and is attached to the frame via at least one sprue. Each sprue is configured to break in response to an applied force that is less than a damage threshold for its respective strain gage, as well as to enable removal of its respective strain gage only in response to an applied force that is greater than anticipated environmentally generated forces.

A rosette matrix comprising a plurality of unpopulated rosette substrates is then mounted in a pick-and-place tool, where each rosette substrate has six electrical terminals arranged in three terminal pairs.

For each rosette substrate of the rosette matrix: (1) conductive adhesive is applied to its electrical terminals; (2) each of three strain gages is removed, one at a time, from its respective gage strip and oriented such that its bond pads are facing one terminal pair of the rosette substrate; and (3) each strain gage is electrically connected to its respective terminal pair via conductive adhesive.

Once all of the rosette substrates have been populated with strain gages, the conductive adhesive is first batch cured and then a structural adhesive is applied to underfill each strain gage. The structural adhesive is subsequently batch cured.

Finally, an optional conformal coating is applied to the matrix and then the individual rosette strain gages are singulated.

In some embodiments, not all of the rosette substrates of a rosette matrix are populated with strain gages.

In some embodiments, a rosette strain gage includes more than three strain gages. In some embodiments, a rosette strain gage includes fewer than three strain gages.

An embodiment in accordance with the present disclosure is a rosette strain gage comprising: a rosette substrate that includes: (i) a flexible substrate that comprises a first material; (ii) a plurality of terminal pairs; and (iii) a plurality of contact pads disposed on the flexible substrate; wherein each terminal of the plurality of terminal pairs is electrically connected with a different contact pad; and a plurality of strain gages that are leadless strain gages, each strain gage of the plurality thereof including a contact pair that is electrically connected with a different terminal pair of the plurality of terminal pairs, wherein each strain gage of the plurality thereof includes a body that comprises a second material that is a semiconductor; wherein each strain gage of the plurality thereof is mechanically affixed to the flexible substrate via a structural adhesive that is configured to transfer strain induced in the flexible substrate to the body of the strain gage.

Another embodiment in accordance with the present disclosure is a method for forming at least one rosette strain gage, the method comprising: mounting a rosette matrix in an automated assembly system, the rosette matrix including a plurality of rosette substrates, each rosette substrate including: (i) a flexible substrate that comprises a first material; (ii) a plurality of contact pads disposed on the flexible substrate; and (iii) a plurality of terminals disposed on the flexible substrate, wherein the plurality of terminals is arranged in a plurality of terminal pairs; wherein each terminal of the plurality thereof is electrically connected with a different contact pad of the plurality thereof; at each rosette substrate of the plurality thereof, electrically connecting each of a plurality of strain gages to a different terminal pair of the plurality thereof, each strain gage being a leadless strain gage that includes: (i) a body that comprises a second material that is a semiconductor; and (ii) a contact pair; wherein each strain gage is attached to its respective terminal pair by electrically and mechanically coupling its respective contact pair and the respective terminal pair; and mechanically affixing each body of the plurality of strain gages to the flexible substrate via a structural adhesive that is configured to transfer strain induced in the flexible substrate to the body.

Yet another embodiment in accordance with the present disclosure is a method for forming at least one rosette strain gage, the method comprising: providing a first rosette substrate, the first rosette substrate including: (i) a first flexible substrate that comprises a first material; and (ii) a first plurality of terminals disposed on the first flexible substrate, wherein the first plurality of terminals is arranged in a first plurality of terminal pairs, each terminal being electrically connected with a different contact pad of a first plurality thereof; providing a first plurality of strain gages, each strain gage of the first plurality thereof being a leadless strain gage having a body and a contact pair, wherein the body includes a second material that is a semiconductor, the first plurality of strain gages including a second plurality of strain gages; aligning the contact pair of each of the second plurality of strain gages with a different terminal pair of the first plurality thereof via an automated assembly system; electrically connecting each contact pair of the second plurality of strain gages with its respective terminal pair of the first plurality thereof; and mechanically affixing each body of the second plurality of strain gages to the first flexible substrate via a structural adhesive such that strain induced in the first flexible substrate is transferred to the body.

BRIEF DESCRIPTION OF THE DRAWINGS

FIG. 4 depicts operations of a method suitable for fabricating a rosette strain gage in accordance with the present disclosure.

FIGS. 5A-B depict schematic drawings of top views of a rosette matrix and rosette substrate, respectively, in accordance with the present disclosure.

DETAILED DESCRIPTION

Figure 1:
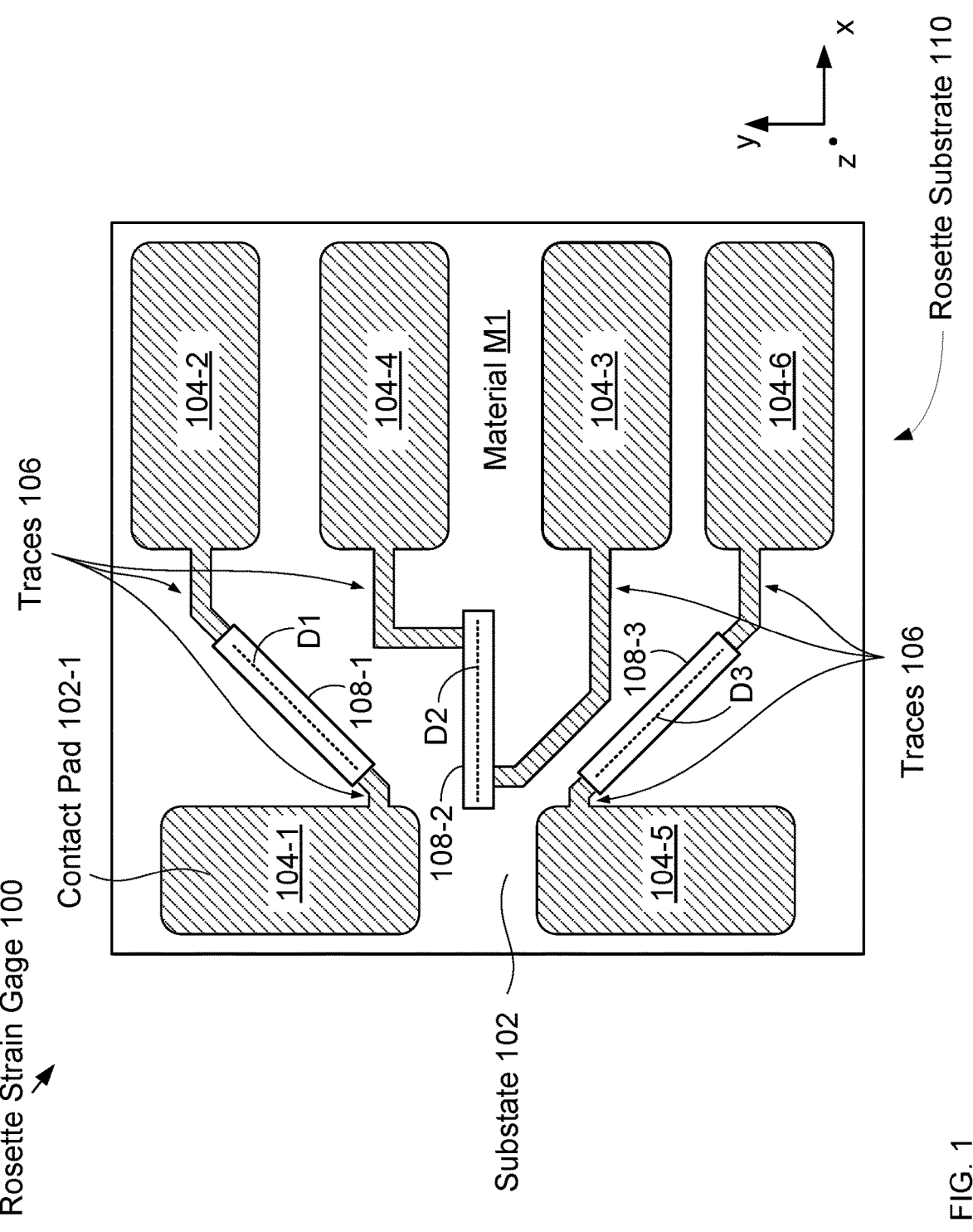
FIG. 1 depicts a schematic drawing of a top view of a rosette strain gage in accordance with the present disclosure.

The following merely illustrates the principles of the disclosure. It will thus be appreciated that those skilled in the art will be able to devise various arrangements which, although not explicitly described or shown herein, embody the principles of the disclosure and are included within its spirit and scope.

Furthermore, all examples and conditional language recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the disclosure.

Unless otherwise explicitly specified herein, the figures comprising the drawing are not drawn to scale.

FIG. 1 depicts a schematic drawing of a top view of a rosette strain gage in accordance with the present disclosure.

Rosette strain gage 100 includes substrate 102, contact pads 104-1 through 104-6, traces 106, and strain gages 108-1 through 108-3.

Substrate 102 is a flexible, non-conductive substrate having thickness t1. Substrate 102 comprises material M1, which is selected based on the application for which rosette strain gage 100 is intended. As will be apparent to one skilled in the art, after reading this Specification, the manner in which rosette strain gage 100 is expected to be used will dictate the desired properties for the material of substrate 102, such as Young's modulus (a.k.a., elastic modulus), $E_1$, other mechanical properties, operating temperature range, compatibility with conductive and structural adhesives, bio-compatibility, and the like. In the depicted example, substrate 102 comprises polyimide; however, other materials (e.g., fiber-reinforced thermoset laminates, liquid-crystal polymers, etc.) can be used for substrate 102 without departing from the scope of the present disclosure.

Each of contact pads 104-1 through 104-6 (referred to, collectively, as contact pads 104) is a conventional contact pad configured to enable electrical connectivity between rosette strain gage 100 and external electronics, such as a processor, amplifier, controller, and the like.

Figure 5A:
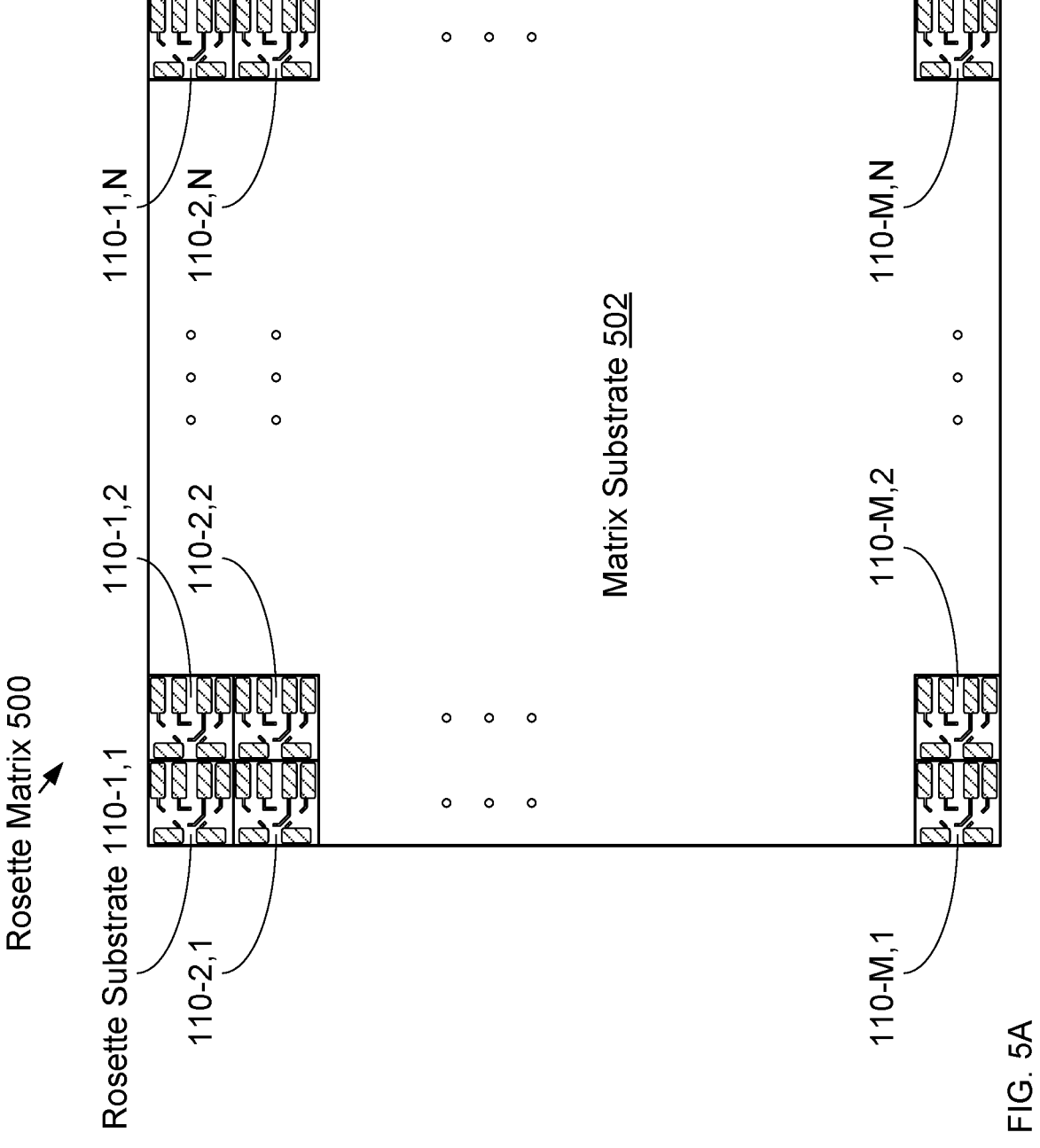
Figure 5B:
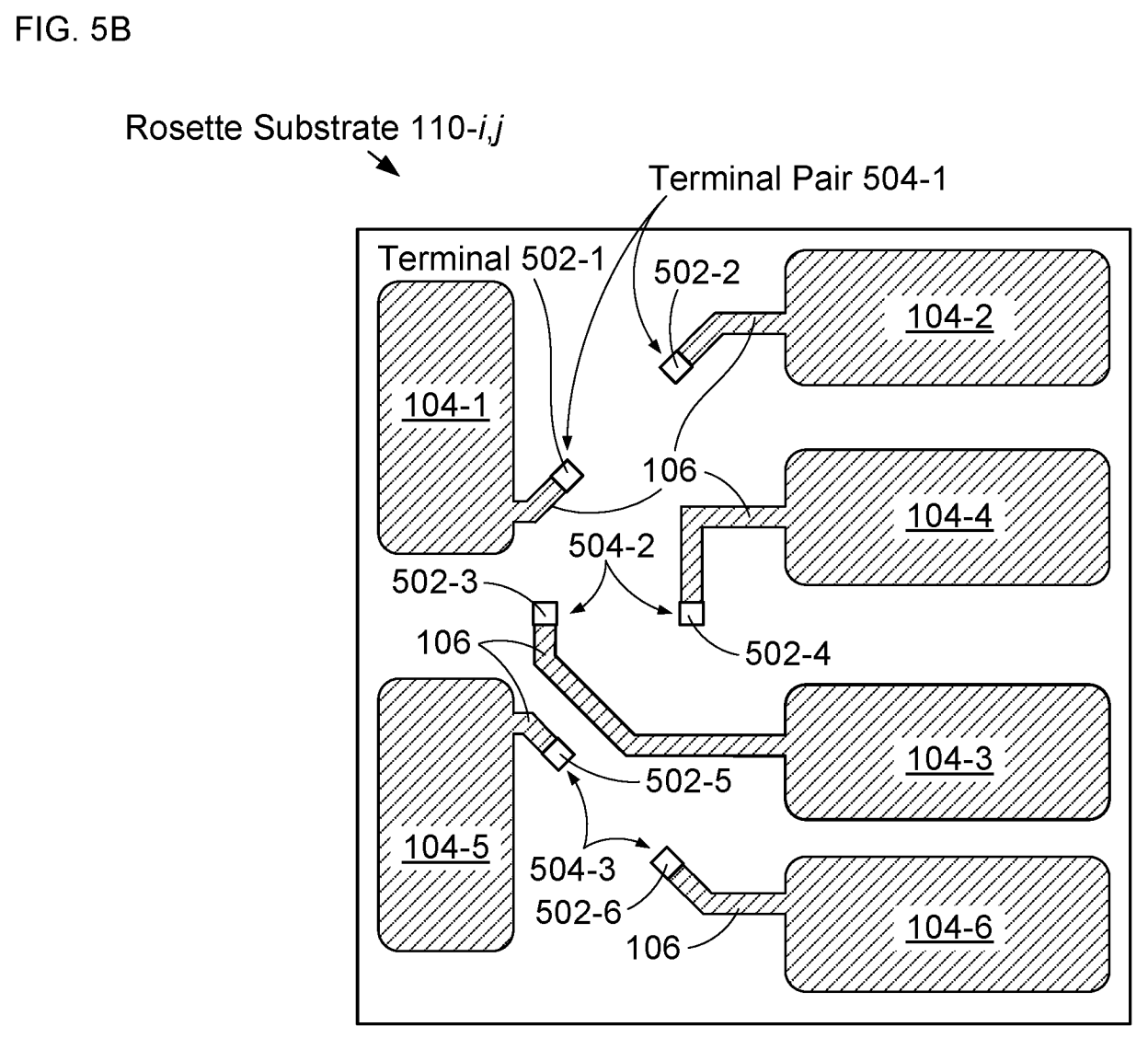

Each of traces 106 is a conductive trace disposed on substrate 102. Each trace 106 extends from its respective contact pad 104 to a corresponding terminal (as shown in FIGS. 5A-B) for enabling electrical contact to a bond pad on a strain gage, thereby establishing electrical connectivity between contact pads 104 and their respective strain gages.

Substrate 102, contact pads 104, and traces 106 collectively define rosette substrate 110.

Strain gages 108-1 through 108-3 (referred to, collectively, as gages 108) are disposed on rosette substrate 110 such that each is electrically connected to a different pair of contact pads 104 via a pair of traces 106. Specifically, strain gage 108-1 is electrically connected between contact pads 104-1 and 104-2, strain gage 108-2 is electrically connected between contact pads 104-3 and 104-4, and strain gage 108-3 is electrically connected between contact pads 104-5 and 104-6.

Furthermore, strain gages 108-1 through 108-3 are arranged on rosette substrate 110 such that the longitudinal axis of each strain gage is oriented along a different one of directions D1 through D3. In the depicted example, directions D1 through D3 are selected such that no two of strain gages 108-1 through 108-3 are colinear or parallel. As a result, rosette strain gage 100 can provide a measurement of the two-dimensional state of strain at virtually any point in a stressed structure. In the depicted example, strain gage 108-1 is aligned with direction D1, which is oriented at a 45° angle to the x-axis, strain gage 108-2 is aligned with direction D2, which is oriented such that it is aligned with the x-axis, and strain gage 108-3 is aligned with direction D3, which is oriented at a −45° angle to the x-axis. As will be apparent to one skilled in the art after reading this Specification, however, myriad arrangements of strain gages on a rosette substrate can be used without departing from the scope of the present disclosure.

Still further, in some embodiments, a rosette strain gage includes more than three strain gages. In some embodiments, a rosette strain gage includes fewer than three strain gages.

Each of strain gages 108-1 through 108-3 (referred, collectively to, as strain gages 108) is a silicon-based strain gage suitable for use in the application for which rosette strain gage 100 is intended. Examples of strain gages suitable for use in embodiments in accordance with the present disclosure are described in detail in U.S. Pat. No. 11,906,375, issued Feb. 20, 2024, which is incorporated herein in its entirety.

Figures 2A, 2B:
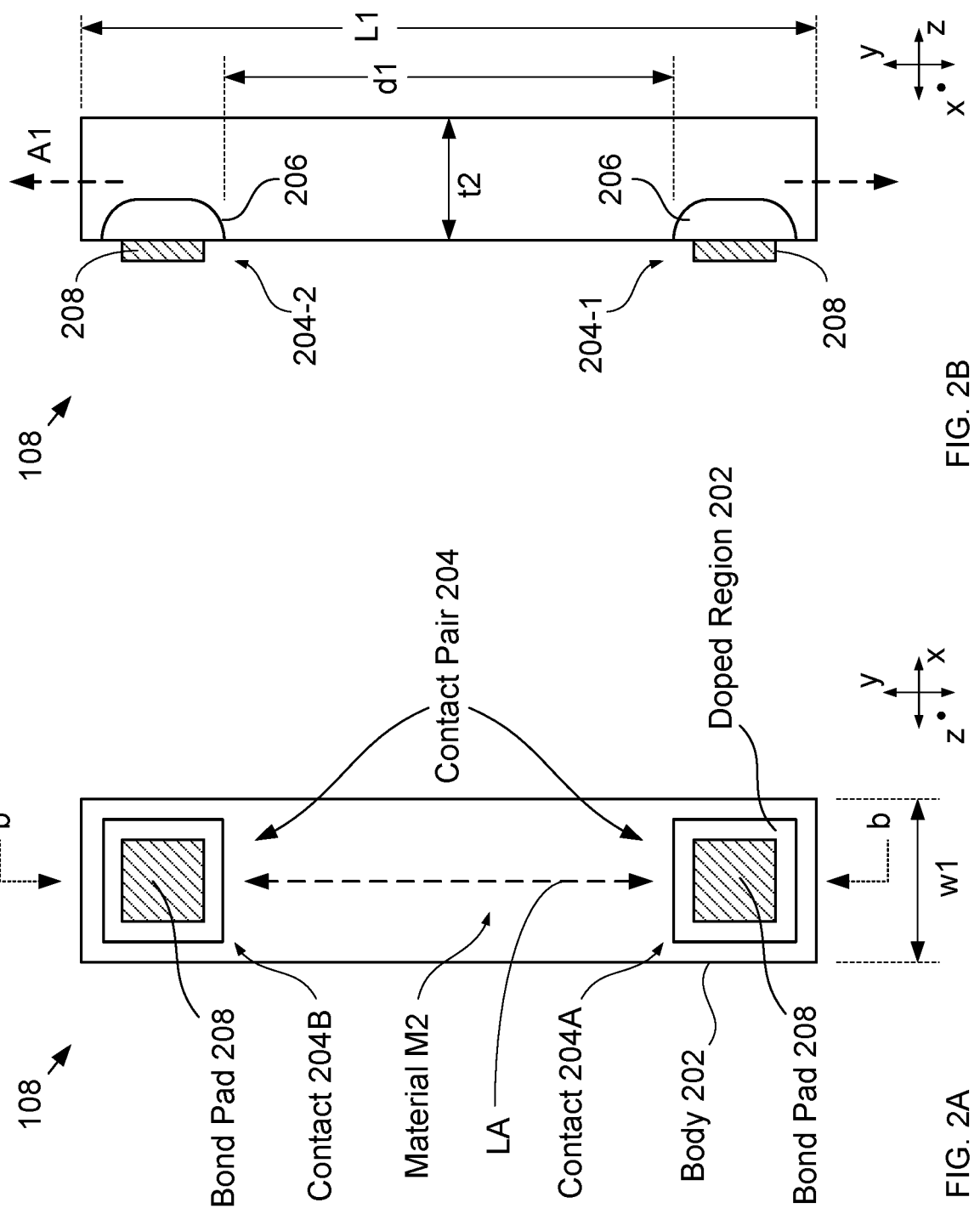
FIGS. 2A-B depict schematic drawings of top and side views, respectively, of a representative strain gage 108.

FIGS. 2A-B depict schematic drawings of top and side views, respectively, of a representative strain gage 108. Strain gage 108 comprises body 202 and contact pair 204.

Body 202 is a bar of semiconductor material M2 having length L1, width w1, thickness t2, and longitudinal axis LA, where material M2 has Young's modulus, $E_2$. As would be apparent to one skilled in the art, the resistance of strain gage 108 is based on the dimensions of body 202 (i.e., its length, width, and thickness), the distance, d1, between the contacts of contact pair 204, and the resistivity, ρ1, of material M2. In the depicted example, M2 is silicon; however, any suitable semiconductor can be used for material M2 without departing from the scope of the present disclosure. Furthermore, although body 202 is rectangularly shaped in the depicted example, any practical shape can be used for body 202 without departing from the scope of the present disclosure. For example, in some embodiments, body 202 can be U-shaped, M-shaped, O-shaped, include one or more dog-bone shaped portions (i.e., portions having wider or narrower ends that taper to a central-body width), be irregularly shaped, etc.

Contact pair 204 includes contacts 204A and 204B, each of which is a conventional electrical contact for making ohmic contact with the material of body 202. Each of contacts 204A and 204B comprises a doped region 206 and bond pad 208.

Doped region 206 is a heavily doped region formed at the top surface of body 202, while bond pad 208 is a conventional metal contact pad formed on top of doped region 206. It is an aspect of the present disclosure that each of bond pads 208 is exposed, enabling electrical contact to be made to it using a conductive adhesive, solder bump, and the like. In other words, the exposed nature of bond pads 208 enables strain gage 108 to be a leadless strain gage.

It should be noted that the ratio of the thicknesses, t1 and t2, of substrate 102 and strain-gage body 202, respectively, can also play a significant role in the performance of rosette strain gage 100. Although any practical ratio of t2:t1 can be used without departing from the scope of the present disclosure, in some embodiments, the ratio of t2:t1 is preferably within the range of approximately 3 to approximately 8.

Furthermore, the choice of the materials included in rosette substrate 110 and strain gage 108 can have significant impact on the properties and performance of a rosette strain gage in accordance with the present disclosure. In some embodiments, the choice of these materials is based on:

i. a ratio of the Young's moduli of materials M2 to M1 that enables surface strain on the object under test to be efficiently transferred through substrate 102 into strain gage 108; or ii. a ratio of t2:t1 that enables surface strain on the object under test to be efficiently transferred through substrate 102 into strain gage 108; or iii. a ratio of the glass transition temperature of material M1 to the anticipated operating temperature that avoids the entry of substrate 102 into its characteristic viscoelastic zone; or iv. a specific surface energy of adhesion and surface roughness of the materials of substrate 102 that enable its compatibility with a wide range of conductive adhesives for bonding bond pads 208 to the terminals of rosette substrate 110; or v. a specific surface energy of adhesion and surface roughness of the materials of substrate 102 that enable its compatibility with a wide range of structural adhesives for bonding strain gages 108 to substrate 102; or vi. the pattern of traces 106 is configured to permit the required flow of current through strain gage 108 without mechanically interfering with the strain field of the object under test; or vii. a compatibility with industry standard printed-circuit board and/or flex circuit patterning, plating, etching, finishing and depaneling methods; or viii. any combination of i, ii, iii, iv, v, vi, and vii.

In some embodiments, the ratio of the Young's modulus of material M2 to the Young's modulus of material M1, E2:E1, is preferably within the range of approximately 6 to approximately 28; however, any suitable ratio can be used without departing from the scope of the present disclosure.

Figure 3:
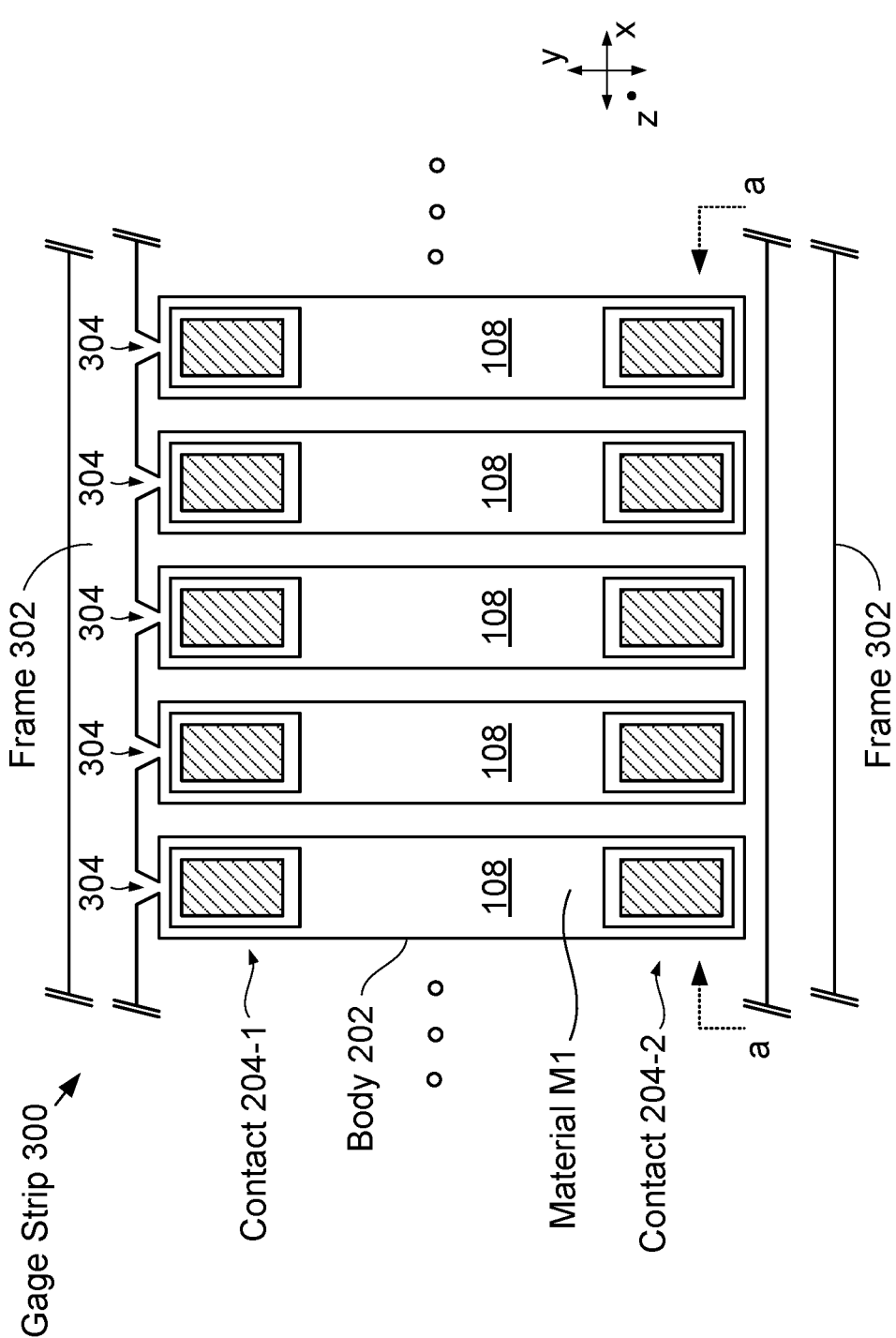
FIG. 3 depicts a schematic drawing of a plan view of a portion of a gage strip in accordance with the present disclosure.

FIG. 3 depicts a schematic drawing of a plan view of a portion of a gage strip in accordance with the present disclosure. Gage strip 300 includes a plurality of substantially identical strain gages 108, which are formed on a common substrate. In the depicted example, each of strain gages 108-1 through 108-3 is physically connected to frame 302 via a single sprue 304, where each of frame 302 and sprues 304 are made of the same material as body 202 (i.e., material M2). In some embodiments, a gage strip includes one or more test strain gages, which are substantially identical copies of strain gages 108 formed at specified test locations on the substrate. In some embodiments, as least one strain gage and/or test strain gage is attached to frame 302 via more than one sprue 304.

It is an aspect of the present disclosure that, because each of the strain gages included in gage strip 300 is leadless, each strain gage can be handled in a conventional automated assembly system with little risk of damage. For the purposes of this Specification, including the appended claims, the term "leadless strain gage" is defined as a strain gage that does not include wire bonds or other electrical leads that extend outward from a surface of the strain gage. Examples of leadless strain gages in accordance with the present disclosure include a strain gage whose only electrical connections are bond pads formed on a surface of the strain gage, a strain gage having only surface-mount contacts, and the like.

As noted above, because bond pads 208 are exposed, a wide range of flip-chip bonding methods and/or surface-mount technologies can be used to mechanically and electrically attach strain gages 108-1 through 108-3 to rosette substrate 110.

It is another aspect of the present disclosure that, as discussed in U.S. Pat. No. 11,906,375, the use of sprues 304 enables gage strip 300 to be handled using conventional handling techniques while also enabling individual strain gages 108 to be easily removed from frame 302 without damage.

For example, in some embodiments, the sprues include stress-concentrating features for facilitating their breakage during packaging by, for example, force applied by an automated assembly system, such as a pick-and-place tool. In some such embodiments, the stress-concentrating features enable the sprues to be broken by an applied force that is (1) too low to cause damage to a strain gage and/or (2) greater than a passive-force threshold that is equal to the maximum force to which a strain gage or gage strip might be unintentionally subjected. In some such embodiments, the stress-concentrating features are designed to break in response to a particular type of lifting force applied to a strain gage by an automated assembly system, such as an end effector of a pick-and-place tool, or during handling processes in which force is applied by a tool such as tweezers, a pincher, a controlled-release tool, and the like.

Typically, therefore, sprues 304 include a sprue-fracture point at which it will break in response to a force imparted on strain gage 108. In similar fashion, body 202 is characterized by a body-fracture point at which it will break in response to a force imparted on strain gage 108. The sprue-fracture point is based, in part, on the fracture strain of material M2 and the dimensions of sprue 304, while the body-fracture point is based, in part, on the fracture strain of material M2 and the dimensions of body 202.

FIG. 4 depicts operations of a method suitable for fabricating a rosette strain gage in accordance with the present disclosure. Method 400 is described with continuing reference to FIGS. 1-3 and FIGS. 5A-B.

Method 400 begins with operation 401, wherein gage strip 300 is provided.

At operation 402, a rosette matrix is loaded into an automated assembly system. In the depicted example, the automated assembly system is a pick-and-place tool; however, any suitable automated assembly system can be used without departing from the scope of the present disclosure.

FIGS. 5A-B depict schematic drawings of top views of a rosette matrix and rosette substrate, respectively, in accordance with the present disclosure. Rosette matrix 500 includes a plurality of substantially identical rosette substrates 110-1,1 through 110-M,N (referred to collectively, as rosette substrates 110), which are arranged in ordered M×N array. In some embodiments, a rosette matrix includes a different arrangement of rosette substrates. For example, in some embodiments, a rosette matrix is arranged in other than an ordered array.

At operation 403, a conductive adhesive is dispensed on each of the terminals 502-1 through 502-6 (referred to, collectively, as terminals 502) of each rosette substrate of rosette matrix 500 to be populated with strain gages. In the depicted example, all of terminals 502 on rosette matrix 500 receive conductive adhesive in operation 403. In some embodiments, terminals 502-1 through 502-6 on only some rosette substrates 110 of rosette matrix 500 receive conductive adhesive.

Terminals 502-1 through 502-6 (referred to, collectively, as terminals 502) are conventional electrical terminals that are exposed to enable their bonding to bond pads 208 via the conductive adhesive. Terminals 502-1 through 502-6 are arranged in terminal pairs 504-1 through 504-3 and are electrically connected to contact pads 104-1 through 104-6, respectively, via traces 106.

Preferably, the conductive adhesive has low viscosity, high glass-transition temperature ($T_g$), high shear strength, high temperature resistance, has good solvent, chemical, and moisture resistance, and high electrical conductivity. In the depicted example, the conductive adhesive is Henkel Loctite® Ablestik (a.k.a., Ablebond) 84-1LMI; however, any suitable conductive adhesive can be used without departing from the scope of the present disclosure.

At operation 404, at each rosette substrate 110-i,j, where i=1 through M and j=1 through N, the automated assembly system mounts strain gages 108-1 through 108-3, one at a time, onto the rosette substrate. Typically, for each strain gage 108-k, where k=1 through 3, operation 404 includes:

a) separating strain gage 108-k from frame 302 by breaking its respective sprue 304;

b) positioning strain gage 108-*k* in a facedown orientation so that its bond pads 208 face rosette substrate 110-*i,j*; and c) placing strain gage 108-*k* into contact with rosette substrate 110-*i,j* such that its contact pair 204-*k* is aligned with the terminal pair 504-*k* of its corresponding contact pads on the rosette substrate.

In some embodiments, rather than depositing conductive adhesive on all of terminals 502 on rosette matrix 500 in one step, both operations 403 and 404 are sequentially performed on the rosette substrates of a rosette matrix. In other words, at each rosette substrate 110-*i,j*, conductive adhesive is dispensed onto terminals 502-1 through 502-6, then it is populated with strain gages in operation 404, after which the next rosette substrate in the rosette matrix receives conductive adhesive, then strain gages, and so on.

Upon completion of operation 404, all of rosette substrates 110 are populated such that each includes a strain gage 108-1 whose contact pair 204-1 is aligned with, and electrically connected to, its respective terminal pair 504-1, a strain gage 108-2 whose contact pair 204-2 is aligned with, and electrically connected to, its respective terminal pair 504-2, and a strain gage 108-3 whose contact pair 204-3 is aligned with, and electrically connected to, its respective terminal pair 504-3. In some embodiments, only some of rosette substrates 110 are populated with strain gages 108-1 through 108-3 during operation 404.

It should be noted that, in some embodiments, at least two of strain gages 108-1 through 108-3 may be provided as part of different gage strips such that they are attached to different frames 302.

At operation 405, the conductive adhesive on rosette matrix 500 is batch cured.

At operation 406, a structural adhesive is dispensed to underfill all of the strain gages 108 on rosette matrix 500. Preferably, the structural adhesive has low viscosity, high glass-transition temperature ($T_g$), high shear strength, high temperature resistance, and has good solvent, chemical, and moisture resistance. In the depicted example, the structural adhesive is Epoxyset EB-177; however, any suitable structural adhesive can be used without departing from the scope of the present disclosure.

It should be noted that the surface energies of one or both of the conductive adhesive and structural adhesive used in rosette strain gage 100 can play a significant role in the performance of the device.

At operation 407, the structural adhesive is batch cured.

At optional operation 408, a conformal coating is applied over the top surface of rosette strain gages 100.

At operation 409, rosette matrix 500, now populated with strain gages 108, is singulated into individual rosette strain gages 100.

It is to be understood that the disclosure teaches just some examples of embodiments in accordance with the present invention and that many variations of the invention can easily be devised by those skilled in the art after reading this disclosure and that the scope of the present invention is to be determined by the following claims.

What is claimed is:

1. A rosette strain gage comprising:
a rosette substrate that includes:
(i) a flexible substrate that comprises a first material;
(ii) a plurality of terminal pairs; and
(iii) a plurality of contact pads disposed on the flexible substrate;

wherein each terminal of the plurality of terminal pairs is electrically connected with a different contact pad; and a plurality of strain gages that are leadless strain gages, each strain gage of the plurality thereof including a contact pair that is electrically connected with a different terminal pair of the plurality of terminal pairs, wherein each strain gage of the plurality thereof includes a body that comprises a second material that is a semiconductor;

wherein each strain gage of the plurality thereof is mechanically affixed to the flexible substrate via a structural adhesive that is configured to transfer strain induced in the flexible substrate to the body of the strain gage.

2. The rosette strain gage of claim 1 wherein each strain gage of the plurality thereof has a longitudinal axis, and each longitudinal axis of the plurality thereof is oriented along a different direction.

3. The rosette strain gage of claim 2 wherein a first strain gage of the plurality thereof is oriented along a first direction, a second strain gage of the plurality thereof is oriented along a second direction that forms a 45° angle with the first direction, and a third strain gage of the plurality thereof is oriented along a third direction that is orthogonal to the first direction.

4. The rosette strain gage of claim 1 wherein the contact pair of each strain gage is electrically connected with its respective terminal pair via a conductive adhesive.

5. The rosette strain gage of claim 1 wherein the first material is a polyimide and the second material is silicon.

6. The rosette strain gage of claim 1 wherein the flexible substrate has a first thickness and each body has a second thickness, and wherein the ratio of the second thickness to the first thickness is within the range of approximately 3:1 to approximately 8:1.

7. The rosette strain gage of claim 1 wherein the first material has a first Young's modulus and the second material has a second Young's modulus, and wherein the ratio of the second Young's modulus to the first Young's modulus is within the range of approximately 6:1 to approximately 28:1.

8. A method for forming at least one rosette strain gage, the method comprising:

mounting a rosette matrix in an automated assembly system, the rosette matrix including a plurality of rosette substrates, each rosette substrate including:
(i) a flexible substrate that comprises a first material;
(ii) a plurality of contact pads disposed on the flexible substrate; and
(iii) a plurality of terminals disposed on the flexible substrate, wherein the plurality of terminals is arranged in a plurality of terminal pairs;
wherein each terminal of the plurality thereof is electrically connected with a different contact pad of the plurality thereof;

at each rosette substrate of the plurality thereof, electrically connecting each of a plurality of strain gages to a different terminal pair of the plurality thereof, each strain gage being a leadless strain gage that includes:
(i) a body that comprises a second material that is a semiconductor; and
(ii) a contact pair;
wherein each strain gage is attached to its respective terminal pair by electrically and mechanically coupling its respective contact pair and the respective terminal pair; and mechanically affixing each body of the plurality of strain gages to the flexible substrate via a structural adhesive that is configured to transfer strain induced in the flexible substrate to the body.

9. The method of claim 8 further comprising separating the plurality of rosette substrates.

10. The method of claim 8 wherein, for each rosette substrate of the plurality thereof, each strain gage attached to its respective terminal pair such that each strain gage of the plurality thereof is oriented along a different direction.

11. The method of claim 10 wherein a first strain gage of the plurality thereof is oriented along a first direction, a second strain gage of the plurality thereof is oriented along a second direction that forms a 45° angle with the first direction, and a third strain gage of the plurality thereof is oriented along a third direction that is orthogonal to the first direction.

12. The method of claim 8 further comprising providing the rosette matrix such the first material is a polyimide.

13. The method of claim 8 further comprising providing the plurality of strain gages such that the second material is silicon.

14. The method of claim 8 further comprising:
providing the rosette matrix such the first material is a polyimide; and
providing the plurality of strain gages such that the second material is silicon.

15. The method of claim 8 further comprising:
providing the rosette matrix such the flexible substrate has a first thickness; and
providing the plurality of strain gages such that each body has a second thickness;
wherein the ratio of the second thickness to the first thickness is within the range of approximately 3:1 to approximately 8:1.

16. The method of claim 8 wherein each strain gage of the plurality thereof is attached to its respective terminal pair by joining each contact of its contact pair to a different terminal of the respective terminal pair via a conductive adhesive.

17. The method of claim 8 wherein the first material has a first Young's modulus and the second material has a second Young's modulus, and wherein the ratio of the second Young's modulus to the first Young's modulus is within the range of approximately 6:1 to approximately 28:1.

18. A method for forming at least one rosette strain gage, the method comprising:
providing a first rosette substrate, the first rosette substrate including:
(i) a first flexible substrate that comprises a first material; and
(ii) a first plurality of terminals disposed on the first flexible substrate, wherein the first plurality of terminals is arranged in a first plurality of terminal pairs, each terminal being electrically connected with a different contact pad of a first plurality thereof;
providing a first plurality of strain gages, each strain gage of the first plurality thereof being a leadless strain gage having a body and a contact pair, wherein the body includes a second material that is a semiconductor, the first plurality of strain gages including a second plurality of strain gages;
aligning the contact pair of each of the second plurality of strain gages with a different terminal pair of the first plurality thereof via an automated assembly system;
electrically connecting each contact pair of the second plurality of strain gages with its respective terminal pair of the first plurality thereof; and
mechanically affixing each body of the second plurality of strain gages to the first flexible substrate via a structural adhesive such that strain induced in the first flexible substrate is transferred to the body.

19. The method of claim 16 further comprising:
mounting a rosette matrix in the automated assembly system, the rosette matrix including the first rosette substrate and a second rosette substrate that includes;
(i) a second flexible substrate that comprises the first material; and
(ii) a second plurality of terminals disposed on the second flexible substrate, wherein the second plurality of terminals is arranged in a second plurality of terminal pairs, each terminal of the second plurality thereof being electrically connected with a different contact pad of a second plurality thereof;
aligning the contact pair of each of a third plurality of strain gages included in the first plurality thereof with a different terminal pair of the second plurality thereof via the automated assembly system;
electrically connecting each contact pair of the third plurality of strain gages with its respective terminal pair of the second plurality thereof;
mechanically affixing each body of the third plurality of strain gages to the second flexible substrate via a structural adhesive such that strain induced in the second flexible substrate is transferred to the body; and
separating the first rosette substrate and the second rosette substrate.

20. The method of claim 16 wherein the first rosette substrate is provided such that the first material is polyimide, and wherein the plurality of strain gages is provided such that the second material is silicon.

21. The method of claim 16 further comprising:
providing the rosette matrix such the first flexible substrate has a first thickness; and
providing the first plurality of strain gages such that each body has a second thickness;
wherein the ratio of the second thickness to the first thickness is within the range of approximately 3:1 to approximately 8:1.

22. The method of claim 16 wherein each strain gage of the second plurality thereof is attached to its respective terminal pair by joining each contact of its contact pair to a different terminal of the respective terminal pair via a conductive adhesive.

23. The method of claim 18 wherein the first material has a first Young's modulus and the second material has a second Young's modulus, and wherein the ratio of the second Young's modulus to the first Young's modulus is within the range of approximately 6:1 to approximately 28:1.

* * * * *